US006215710B1

(12) United States Patent
Han et al.

(10) Patent No.: US 6,215,710 B1
(45) Date of Patent: Apr. 10, 2001

(54) APPARATUS AND METHOD FOR CONTROLLING DATA STROBE SIGNAL IN DDR SDRAM

(75) Inventors: Jong-Hee Han; Shin-Ho Chu, both of Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/428,535

(22) Filed: Oct. 28, 1999

(30) Foreign Application Priority Data

Oct. 28, 1998 (KR) .................................................. 98-45297

(51) Int. Cl.$^7$ ...................................................... G11C 7/00
(52) U.S. Cl. ............................................. 365/193; 365/233
(58) Field of Search .................................... 365/193, 233, 365/189.01

(56) References Cited

U.S. PATENT DOCUMENTS 6,061,292 * 5/2000 Su et al. ......................... 365/230.06

* cited by examiner

Primary Examiner—Vu A. Le
(74) Attorney, Agent, or Firm—Jacobson, Price, Holman & Stern, PLLC

(57) ABSTRACT

A method for controlling a data strobe signal having preamble and postamble sections in a double data rate (DDR) synchronous dynamic random access memory (SDRAM), wherein the preamble section is a low signal section of the data strobe signal one clock before data is issued and wherein the postamble section is a low signal section of the data strobe signal half clock before the data issue is complete in a data issue section, includes the steps of: controlling a high impedance status of the data strobe signal at sections, except for the data issue section, the preamble section and the postamble section, in response to a first control signal, wherein the high impedance status is related to a level between high and low signal levels; and controlling a point of time when the preamble section of the data strobe signal begins in response to a second control signal.

6 Claims, 7 Drawing Sheets

APPARATUS AND METHOD FOR CONTROLLING DATA STROBE SIGNAL IN DDR SDRAM

FIELD OF THE INVENTION

The present invention relates to a double data rate (DDR) synchronous dynamic random access memory (SDRAM) and, more particularly, to an apparatus and method for controlling a data strobe signal at reading data of a DDR SDRAM.

DESCRIPTION OF THE PRIOR ART

Generally, a conventional SDRAM synchronized by an external system clock is employed as a semiconductor memory device to improve operation speed. A conventional SDRAM employs a rising edge of a clock, while a DDR SDRAM employs rising and falling edges of the clock. Accordingly, since the DDR SDRAM can implement high operation speed, the DDR SDRAM is known as a next generation DRAM. The conventional DDR SDRAM uses a data strobe signal to minimize time skew caused between memory chips of a memory chip set at read operation.

Referring to FIG. 1, there is shown a timing diagram at reading data of a DDR SDRAM in accordance with the prior art. At first, a glossary of "column address strobe (CAS) latency value" is defined as the number of clocks needed until data is issued at a point of time when a read command has issued. Also, a glossary of "burst length value" is defined as the number of consecutive data. As shown, the CAS latency value is 2 and the burst length value is 4. When data of the DDR SDRAM is read, the data should be issued at the rising and falling edges in response to an enable state of a data strobe signal DQS.

In order that the two consecutive data may be issued, the data strobe signal DQS has a high impedance status HI-Z, which is related to a level between high and low signal levels. When the data strobe signal DQS is low one clock before the data is issued, it is defined as a preamble section. When the data is issued, the data should be synchronized with edges of the data strobe signal DQS. When the data strobe signal DQS is low half clock before the data issue is complete, it is defined as a postamble section. The data strobe signal DQS is controlled so that the preamble and postamble sections of the data strobe signal DQS are set.

Referring FIG. 2, there is shown another timing diagram illustrating a conventional method for controlling a data strobe signal. In case where the CAS latency value is 2 and the burst length value is 2, two data are consecutively issued two clocks after a read command RD1 is issued. Typically, the data strobe signal DQS is controlled by a data strobe enable signal QS_ENABLE. However, when a read command RD2 is issued two clocks after the read command RD1 is issued, the postamble and preamble sections A and B of the data strobe signal DQS are consecutive. At this time, the data strobe enable signal QS_ENABLE has a section C, which is activated from a falling edge to a rising edge. If the time of the section C is short, the rising edge of the section C is not detected. Accordingly, since the rising edge of the section C may be not detected, the preamble section disappears. In order that the rising edge of the section C may be detected, a point of time when the data strobe enable signal QS_ENABLE is inactivated from a high signal to a low signal must become earlier. Otherwise, a point of time when the data strobe enable signal QS_ENABLE is activated from a low signal to a high signal must become later. When the point of time inactivated from the high signal to the low signal becomes earlier, the postamble section is influenced. Also, when the point of time activated from the low signal to the high signal becomes later, the preamble section is influenced.

As a result, since the conventional method for controlling the data strobe signal by using only one control signal does not correctly set the preamble and postamble sections, data of the DDR SDRAM may not be read.

SUMMARY OF THE INVENTION

It is, therefore, an object of the present invention to provide an apparatus for controlling a data strobe signal at reading data of a DDR SDRAM by using two control signals.

It is, therefore, another object of the present invention to provide a method for controlling a data strobe signal at reading data of a DDR SDRAM by using two control signals.

In accordance with one aspect of the present invention, there is provided a method for controlling a data strobe signal having preamble and postamble sections in a double data rate (DDR) synchronous dynamic random access memory (SDRAM), wherein the preamble section is a low signal section of the data strobe signal one clock before data is issued and wherein the postamble section is a low signal section of the data strobe signal half clock before the data issue is complete in a data issue section, comprising the steps of: controlling a high impedance status of the data strobe signal at sections, except for the data issue section, the preamble section and the postamble section, in response to a first control signal, wherein the high impedance status is related to a level between high and low signal levels; and controlling a point of time when the preamble section of the data strobe signal begins in response to a second control signal.

In accordance with another aspect of the present invention, there is provided an apparatus for controlling a data strobe signal of a double data rate (DDR) synchronous dynamic random access memory (SDRAM), comprising: a first control signal generator for receiving CAS latency signals containing a CAS latency value, respectively, and output enable signals, wherein the CAS latency value is defined as the number of clocks needed until data is issued at a point of time when a read command is issued; selecting an output enable signal delayed by the predetermined number of clocks, wherein the predetermined number of clocks is less one clock than the CAS latency value of a CAS latency signal at a point of time when a read command is activated; and generating a first control signal identical to the selected output enable signal; a second control signal generator for generating a second control signal activated when the selected output enable signal is activated; and generating the second control signal inactivated in response to a rising or falling delay lock loop signal selected by the CAS latency signal, while the first control signal is inactivated; and an initialization means for initializing the second control signal.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Figure 1:
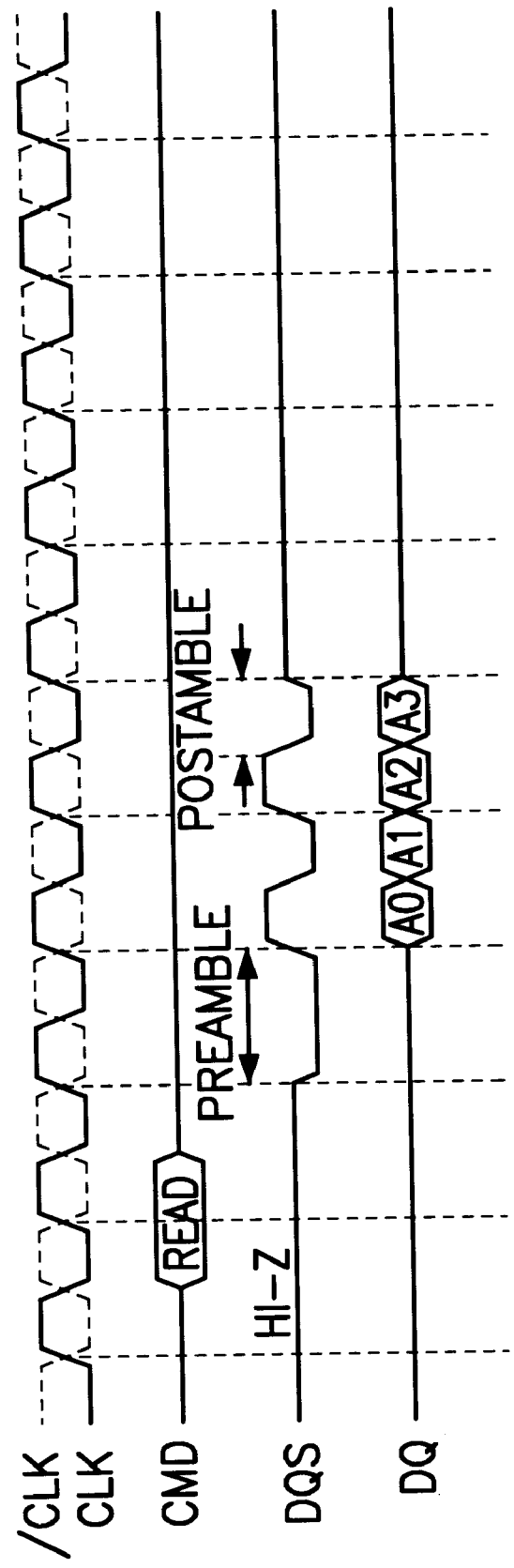
FIG. 1 shows a timing diagram at reading data of a DDR SDRAM in accordance with the prior art.
Figure 2:
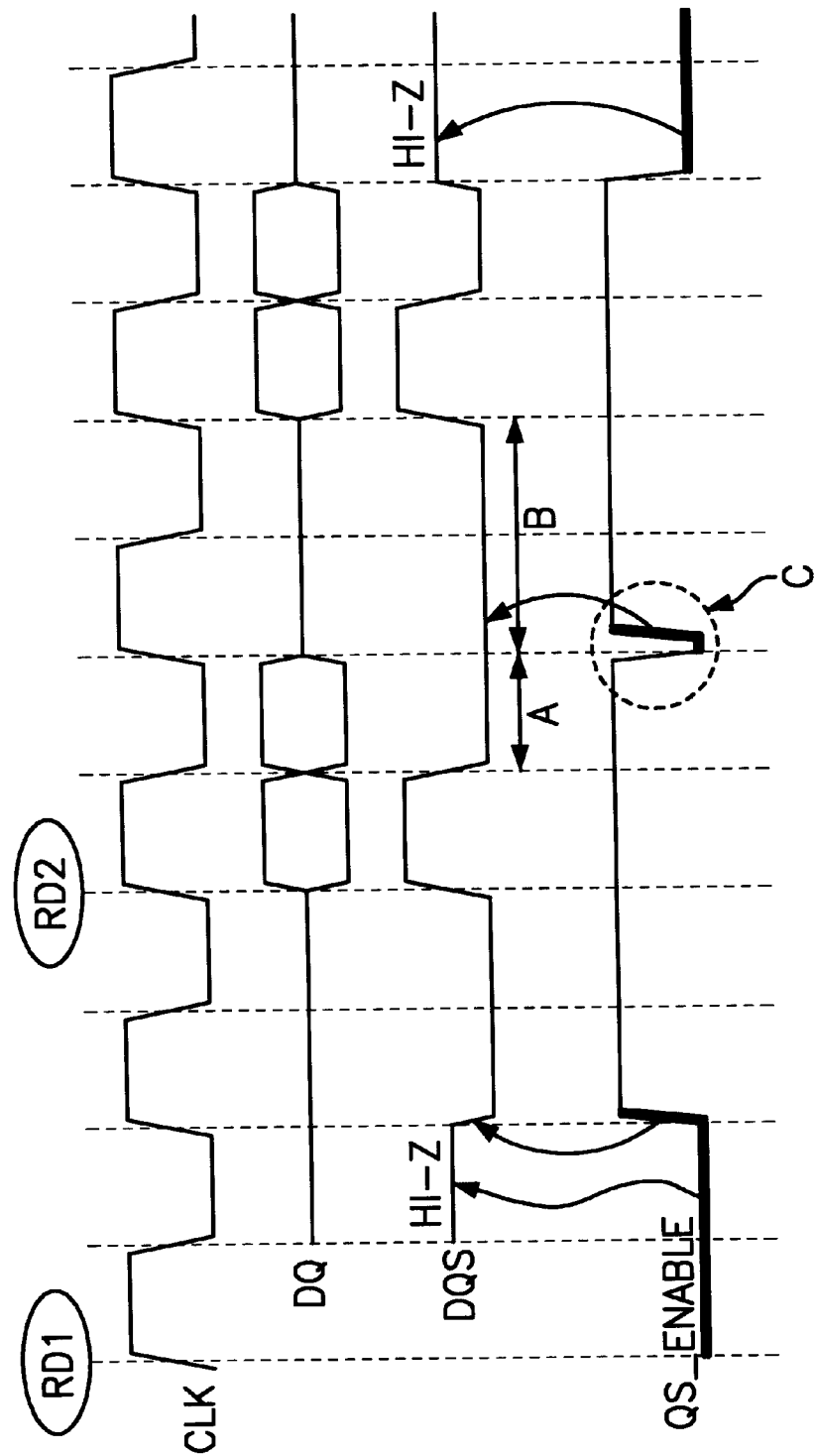
FIG. 2 is another timing diagram illustrating a conventional method for controlling a data strobe signal.
Figure 3:
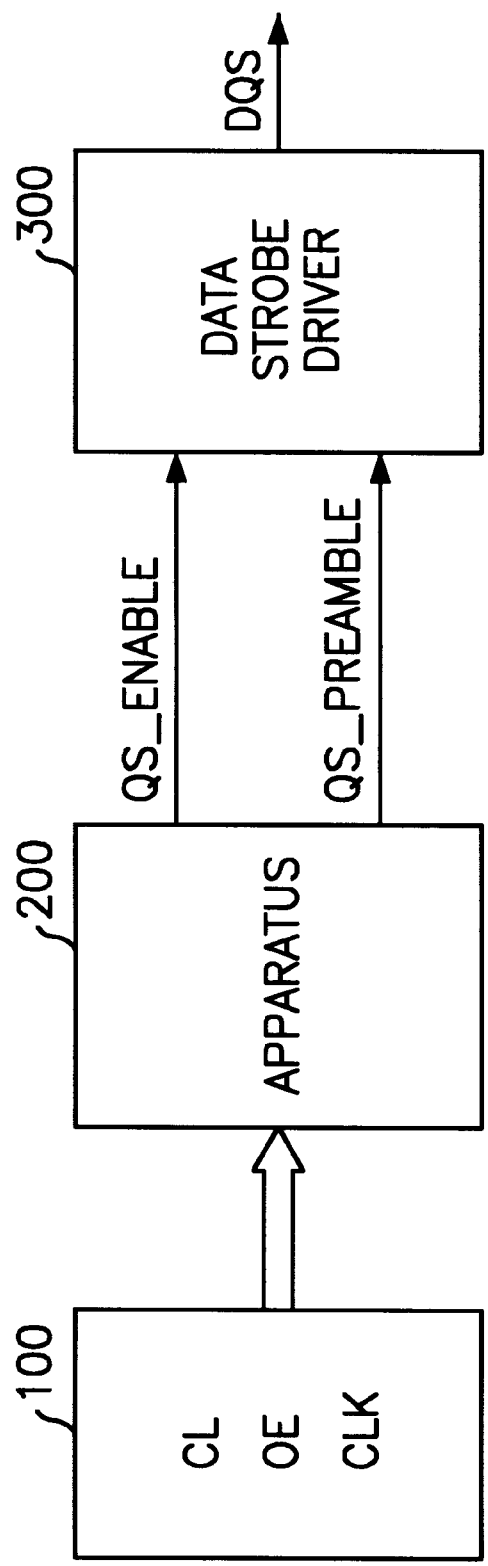
FIG. 3 depicts a block diagram including an apparatus for controlling a data strobe signal in accordance with the present invention.

Referring to FIG. 3, an apparatus 200 for controlling a data strobe signal receives CAS latency signal CL, an output enable signal OE and a clock signal CLK from a block 100. The apparatus 200 generates a control signal QS_ENABLE and a control signal QS_PREAMBLE to control a data strobe signal driver 300.

Figure 4:
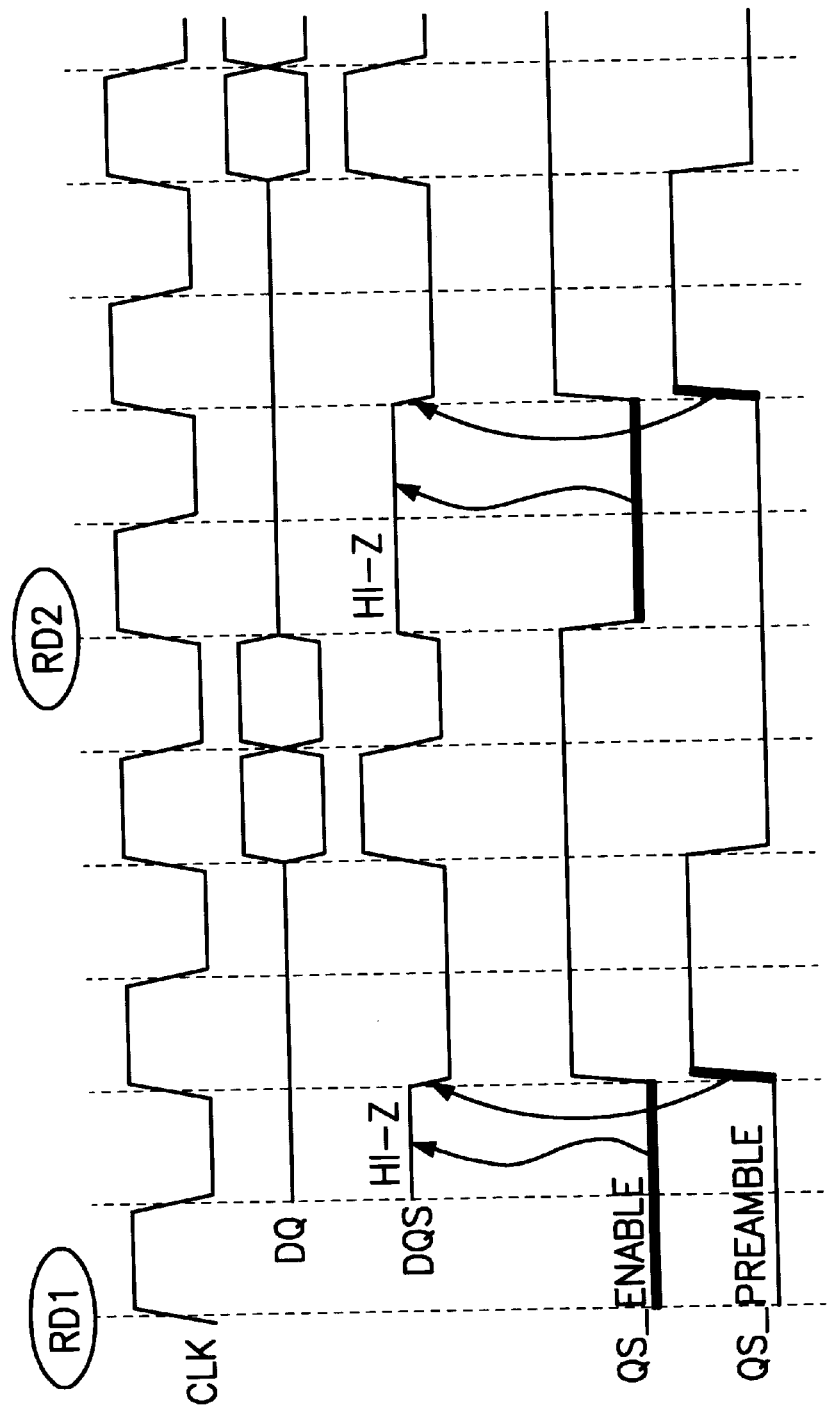
FIGS. 4 and 5 are timing diagrams illustrating a method for controlling a data strobe signal in accordance with the present invention.

Referring to FIG. 4, the CAS latency value is 2 and the burst length value is 2. Three clocks after a read command RD1 is issued, a read command RD2 is issued. The control signal QS_PREAMBLE controls a point of time when the preamble section of a data strobe signal DQS begins. When the control signal QS_PREAMBLE is activated from the low signal to the high signal, the preamble section of the data strobe signal DQS begins.

The control signal QS_ENABLE is maintained in the high impedance status of the data strobe signal DQS at sections except for a data issue section, the preamble section and a postamble section. When the control signal QS_ENABLE is at the low state, the data strobe signal DQS has a high impedance status HI-Z.

Figure 5:
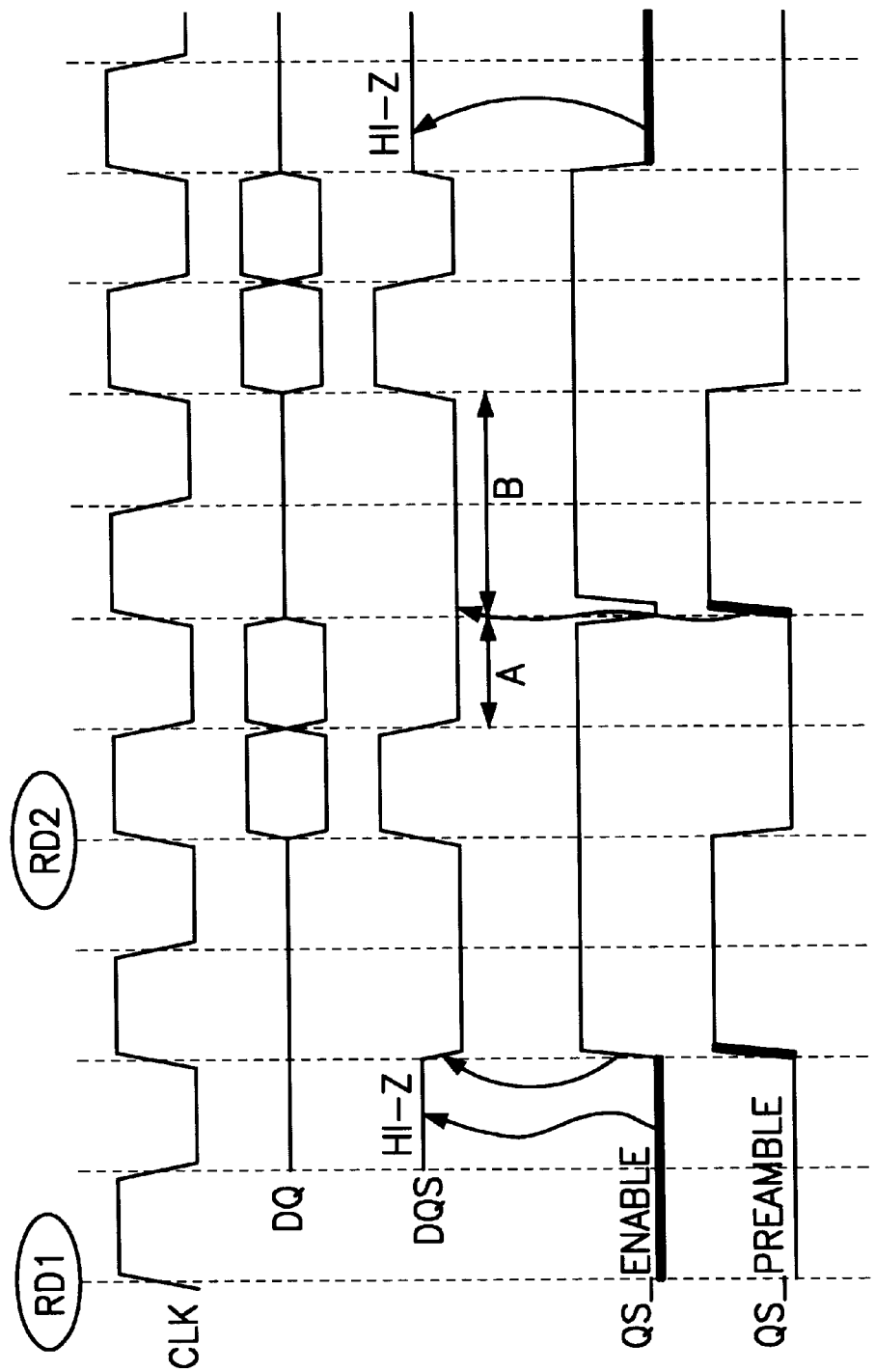

Referring to FIG. 5, the CAS latency value is 2 and the burst length value is 2. When a read command RD2 is issued two clocks after a read command RD1 is issued, the postamble and preamble sections A and B of the data strobe signal DQS are consecutive. Two clocks after a read command RD1 is issued, a read command RD2 is issued. At this time, the preamble section B of the data strobe signal DQS is controlled by a rising edge of the control signal QS_PREAMBLE.

Figure 6:
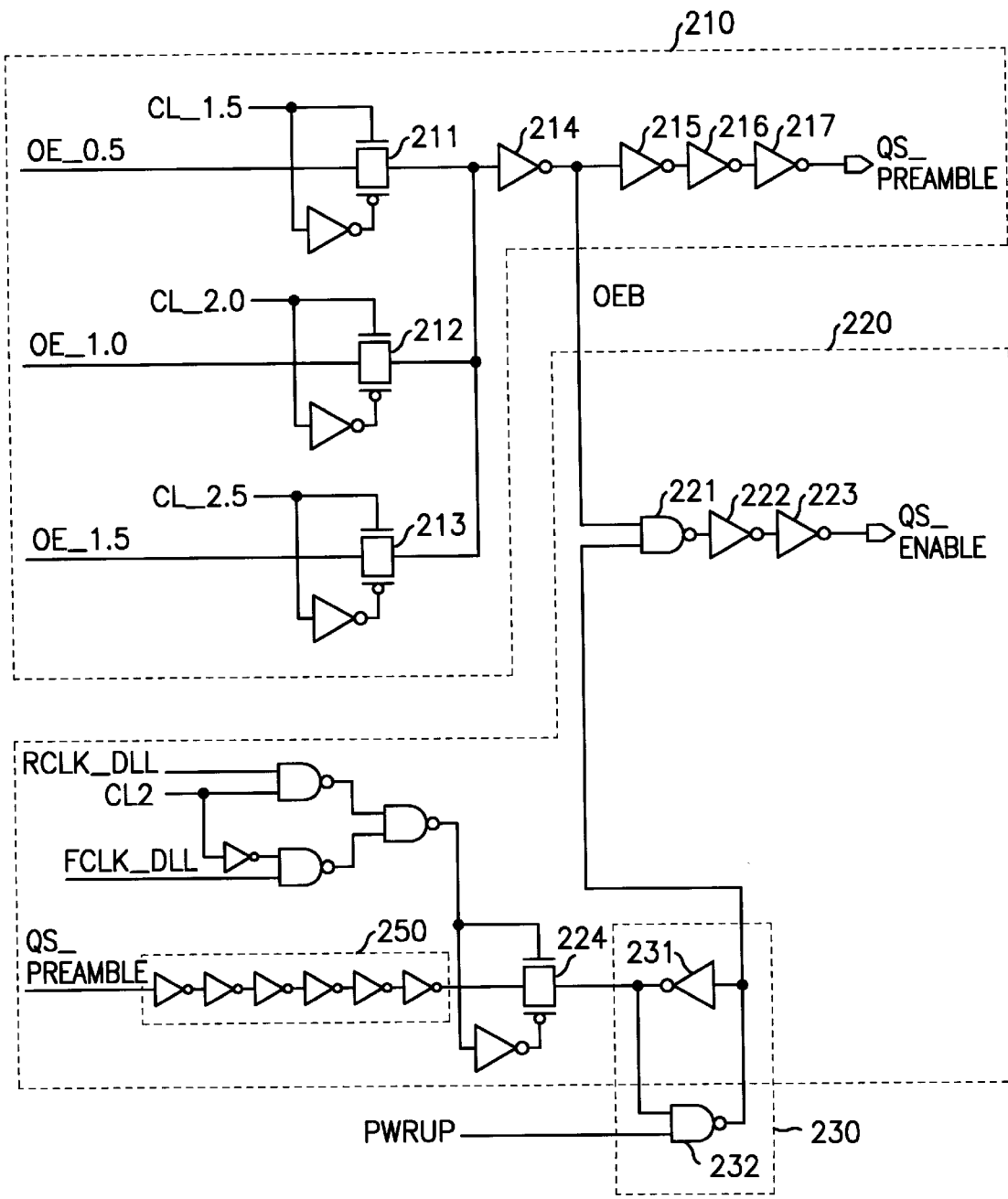
FIG. 6 is a circuit diagram illustrating an apparatus for controlling a data strobe signal in accordance with the present invention.
Figure 7:
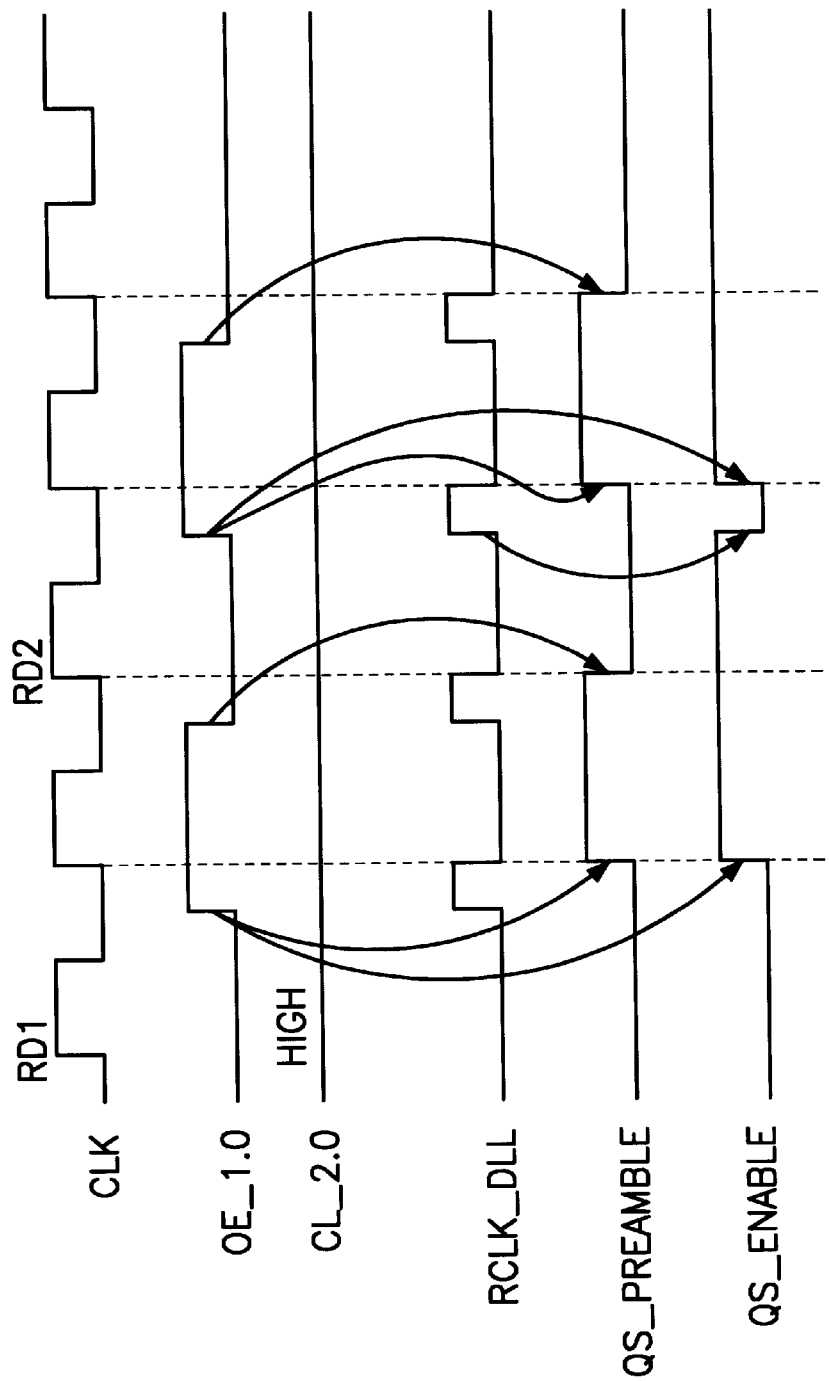
FIG. 7 is a timing diagram illustrative of a method for controlling a data strobe signal in accordance with the present invention.

Referring to FIGS. 6 and 7, the apparatus 200 for controlling the data strobe signal shown in FIG. 3 includes a control signal generator 220, a control signal generator 210 and an initialization block 230. The control signal generator 220 generates a control signal QS_ENABLE. The control signal generator 210 generates a control signal QS_PREAMBLE. The initialization block 230 initializes the apparatus 200 by using a power-up signal PWRUP.

A CAS latency signal CL_1.5 informs that data is issued 1.5 clocks after a read command is activated. A CAS latency signal CL_2 informs that data is issued 2 clocks after the read command is activated. A CAS latency signal CL_2.5 informs that data is issued 2.5 clocks after the read command is activated.

When the CAS latency signal CL_1.5 is activated, the control signal generator 210 outputs the control signal QS_PREAMBLE, i.e. an output enable signal OE_0.5 delayed by half clock at a point of time when the read command is activated.

When the CAS latency signal CL_2 is activated, the control signal generator 210 outputs the control signal QS_PREAMBLE, i.e. an output enable signal OE_1.0 delayed by one clock at a point of time when the read command is activated.

When the CAS latency signal CL_2.5 is activated, the control signal generator 210 outputs the control signal QS_PREAMBLE, i.e. an output enable signal OE_1.5 delayed by 1.5 clocks at a point of time when the read command is activated.

In other words, the control signal generator 210 receives the CAS latency signals CL_1.5, CL_2 and CL_2.5 and output enable signals OE_0.5, OE_1.0 and OE_1.5. Then, the control signal generator 220 outputs the control signal QS_PREAMBLE, i.e. the output enable signal OE_0.5, OE_1.0 or OE_1.5 delayed by the predetermined number of clocks, wherein the predetermined number of clocks is less one clock than the CAS latency value of a CAS latency signal at a point of time when a read command is activated. The predetermined number of clocks is decided by the CAS latency signal CL_1.5, CL_2 or CL_2.5. To transfer the control signal QS_PREAMBLE delayed by the predetermined number of clocks in response to the CAS latency signal, the control signal generator 210 employs pass gates 211, 212 and 213 and inverters 214, 215, 216 and 217.

When the output enable signal is activated to the high signal in response to the CAS latency signal, the control signal QS_ENABLE is activated to the high signal. While the control signal QS_PREAMBLE is inactivated to the low signal, a rising clock delay lock loop signal RCLK_DLL or a falling clock delay lock loop signal FCLK_DLL is activated to the high signal. Then, the control signal QS_ENABLE is inactivated to the low signal. The rising clock delay lock loop signal RCLKDLL has a pulse at a rising edge of a clock CLK. The falling clock delay lock loop signal FCLK_DLL has a pulse at a falling edge of the clock CLK.

A NAND gate 221 outputs the control signal QS_ENABLE through inverters 222 and 223. When a signal OEB as one input signal of the NAND gate 221 is low, the control signal QS_ENABLE is maintained at the high signal state. The output enable signal selected by the CAS latency signal is inverted by an inverter 214. The signal OEB is the inverted output enable signal. When the selected output enable signal is activated to the high signal, the control signal QS_ENABLE is activated to the high signal. On the other hand, the NAND gate 221 receives the control signal QS_PREAMBLE inverted by a plurality of inverters 250 as the other input signal of the NAND gate 221. The pass gate 224 receives the rising clock delay lock loop signal RCLK_DLL or the falling clock delay lock loop signal FCLK_DLL, as a gate input signal of the pass gate 224. When the signal OEB and the control signal QS_PREAMBLE are maintained at the high signal state and the low signal state, respectively, the rising clock delay lock loop signal RCLK_DLL or the falling clock delay lock loop signal FCLK_DLL is activated to the high signal. Then, the control signal QS_ENABLE is inactivated to the low signal.

When the CAS latency signal CL2 is high, a gate of the pass gate 224 is controlled by the rising clock delay lock loop signal RCLK_DLL. When the CAS latency signal CL2 is low, a gate of the pass gate 224 is controlled by the falling clock delay lock loop signal FCLK_DLL.

The initialization block 230 initializes the other input signal of the NAND gate 221. The initialization block 230 includes an inverter 231 and a NAND gate 232. The initialization block 230 receives a power-up signal PWRUP as one input signal of the initialization block 230 and the control signal QS_PREAMBLE transferred through the pass gate 224 as the other input signal of the initialization block 230.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for controlling a data strobe signal having preamble and postamble sections in a double data rate (DDR) synchronous dynamic random access memory (SDRAM), wherein the preamble section is a low signal section of the data strobe signal one clock before data is issued and wherein the postamble section is a low signal section of the data strobe signal half clock before the data issue is complete in a data issue section, comprising the steps of:

controlling a high impedance status of the data strobe signal at sections, except for the data issue section, the preamble section and the postamble section, in response to a first control signal, wherein the high impedance status is related to a level between high and low signal levels; and controlling a point of time when the preamble section of the data strobe signal begins in response to a second control signal.

2. The method as recited in claim 1, wherein the data strobe signal has the high impedance status while the first control signal is low and wherein the preamble section of the data strobe signal begins at a point of time when the second control signal is activated from a low signal to a high signal.

3. An apparatus for controlling a data strobe signal of a double data rate (DDR) synchronous dynamic random access memory (SDRAM), comprising:

a first control signal generator for receiving CAS latency signals containing a CAS latency value, respectively, and output enable signals, wherein the CAS latency value is defined as the number of clocks needed until data is issued at a point of time when a read command is issued; selecting an output enable signal delayed by the predetermined number of clocks, wherein the predetermined number of clocks is less one clock than the CAS latency value of a CAS latency signal at a point of time when a read command is activated; and generating a first control signal identical to the selected output enable signal;

a second control signal generator for generating a second control signal activated when the selected output enable signal is activated; and generating the second control signal inactivated in response to a rising or falling delay lock loop signal selected by the CAS latency signal, while the first control signal is inactivated; and an initialization means for initializing the second control signal.

4. The apparatus as recited in claim 3, wherein said first control signal generator includes:

a first pass gate for passing the output enable signal in response to the CAS latency signal; and inverters for buffering an output signal of said first pass gate, wherein said inverters is serially connected to each other and the number of said inverters is an even number.

5. The apparatus as recited in claim 4, wherein said second control signal generator includes:

a second pass gate for passing the first control signal in response to the rising or falling clock delay lock loop signal selected by the CAS latency signal; and a first NAND gate forNANDing an inverted first control signal and an inverted output enable signal.

6. The apparatus as recited in claim 5, wherein said initialization means includes:

a second NAND gate for NANDing a power-up signal and the output enable signal; and an inverter for inverting the inverted first control signal.

* * * * *